(12) United States Patent
Masui (10) Patent No.: US 8,643,014 B2
(45) Date of Patent: Feb. 4, 2014

(54) ELECTRO-OPTICAL DEVICE AND ELECTRONIC APPARATUS

(75) Inventor: Junichi Masui, Fujimi-cho (JP)

(73) Assignee: Seiko Epson Corporation, Tokyo (JP)

( * ) Notice: Subject to any disclaimer, the term of this patent is extended or adjusted under 35 U.S.C. 154(b) by 267 days.

(21) Appl. No.: 13/295,258

(22) Filed: Nov. 14, 2011

(65) Prior Publication Data

US 2012/0126237 A1    May 24, 2012

(30) Foreign Application Priority Data

Nov. 19, 2010    (JP) ................................. 2010-258645

(51) Int. Cl.
*H01L 29/04*    (2006.01)

(52) U.S. Cl.
USPC .......... 257/59; 257/72; 257/E33.064; 349/39; 349/139

(58) Field of Classification Search
USPC ....... 257/59, 72, E33.064; 349/5, 38, 39, 139
See application file for complete search history.

(56) References Cited

U.S. PATENT DOCUMENTS

| | | | |
|---|---|---|---|
| 6,313,481 B1* | 11/2001 | Ohtani et al. | 257/59 |
| 6,850,292 B1* | 2/2005 | Murade | 349/44 |
| 6,861,670 B1* | 3/2005 | Ohtani et al. | 257/66 |
| 7,015,141 B2* | 3/2006 | Yamazaki | 438/689 |
| 7,820,464 B2* | 10/2010 | Yamazaki et al. | 438/29 |
| 2010/0171131 A1 | 7/2010 | Iki | |

FOREIGN PATENT DOCUMENTS

| | | |
|---|---|---|
| JP | 2008-26348 A | 2/2008 |
| JP | 2009-122256 A | 6/2009 |
| JP | 2010-176119 A | 8/2010 |

* cited by examiner

*Primary Examiner* — Daniel Luke
*Assistant Examiner* — Joseph C Nicely
(74) *Attorney, Agent, or Firm* — ALG Intellectual Property, LLC (57) ABSTRACT

An electro-optical device is provided with a data line which are provided in a pixel region, a pixel electrode formed from a transparent conductive material which is upper layer than the data line, a storage capacitance electrode which is provided in a layer between the pixel electrode and the data line so as to face the pixel electrode via a capacitance insulation film, an additional capacitance which has a first capacitance electrode and a second capacitance electrode which is formed in the same layer as the pixel electrode and the storage capacitance electrode, respectively. The second capacitance electrode is electrically connected to the data line.

6 Claims, 9 Drawing Sheets

ELECTRO-OPTICAL DEVICE AND ELECTRONIC APPARATUS

BACKGROUND

1. Technical Field

The present invention relates to a technical field of an electro-optical device such as a liquid crystal device and an electronic apparatus which is provided with the electro-optical device such as a liquid crystal projector.

2. Related Art

In this type of electro-optical device, for example, an electro-optical material such as a liquid crystal is interposed between a pair of substrates. In a display region of one of the substrates out of the pair of substrates, a pixel electrode formed from ITO (Indium Tin Oxide), a scanning line and a data line for performing selective driving of the pixel electrode, and a TFT (thin film transistor) as a pixel switching element are made with a laminated structure via an interlayer insulating film and are configured so that active matrix driving is possible. The pixel electrode is arranged, for example, on the uppermost layer in the laminated structure on the one substrate. In addition, with the aim of increasing the contrast and the like, a storage capacitance is provided between the TFT for pixel switching and the pixel electrode.

For example, in JP-A-2009-122256 and JP-A-2010-176119, a technique is disclosed where a high aperture ratio is secured and the capacitance value of the storage capacitance is increased by the storage capacitance being configured by the pixel electrode and a capacitance electrode formed from ITO which is provided so as to face the lower layer side of the pixel electrode via a capacitance insulation film.

On the other hand, in this type of electro-optical device, a technique is known where additional capacitance is provided by a portion of the data lines being electrically connected in order to suppress the generation of display irregularities which are caused by push-down of the image signal potential which is written to the data lines (for example, JP-A-2008-26348).

In a case where one of the capacitance electrodes out of the pair of capacitance electrodes which configure the additional capacitance as described above is formed from ITO which is arranged on the uppermost layer in the same manner as the pixel electrode and is electrically connected, for example, with a terminal formed from aluminum (Al) or the like which is exposed on the surface of the substrate, there are technical problems where there are concerns that there may be galvanic corrosion in a wet process such as wet etching, peeling off of a photoresist, or the like which is performed, for example, when the terminal is exposed or when patterning the capacitance electrode in the manufacturing process. That is, when the capacitance electrode formed from ITO which is arranged on the uppermost layer on the substrate, and for example, the terminal formed from a metal such as aluminum or the like are electrically connected, there is a concern that a current may flow between the terminal and the capacitance electrode due to treatment liquid such as etching liquid, resist peeling liquid, or the like which is used in the wet treatment process and there may be galvanic corrosion such as the capacitance electrode formed from ITO being dissolved in the treatment liquid or being corroded away.

SUMMARY

An advantage of some aspects of the invention is that an electro-optical device able to perform high-quality display, where it is possible to suppress generation of galvanic corrosion in the wet treatment process, and an electronic apparatus which is provided with the electro-optical device are provided.

An electro-optical device according to an aspect of the invention is provided with a substrate, a scanning line and a data line which are provided in a pixel region on the substrate, a pixel electrode formed from a transparent conductive material which is provided further towards an upper layer side than the scanning line and the data line so as to correspond to the intersection of the scanning line and the data line, a storage capacitance electrode which is provided in a layer between the pixel electrode and the scanning line and the data line so as to face the pixel electrode via a capacitance insulation film, an additional capacitance which has a first capacitance electrode which is formed in the same layer as the pixel electrode and a second capacitance electrode which is formed in the same layer as the storage capacitance electrode and is electrically connected to the data line, and which is provided in a region between the periphery of the pixel region and the periphery of the substrate, and a terminal which is provided in the region, is electrically connected to the first capacitance electrode, and is formed in the same layer as the pixel electrode.

According to the electro-optical device of the aspect of the invention, the scanning line and the data line are provided so as to intersect each other in the pixel region on the substrate. The pixel electrode is provided further towards an upper layer side than the scanning line and the data line. The pixel electrode is formed from, for example, a transparent conductive material such as ITO and a plurality thereof are provided in, for example, a matrix formation in the pixel region on the substrate to correspond to the intersection of the scanning line and the data line. The pixel electrode is arranged, for example, on the uppermost layer in the laminated structure on the substrate. Furthermore, the storage capacitance electrode is provided in a layer (lower layer side) between the pixel electrode and the scanning line and the data line so as to face the pixel electrode via the capacitance insulation film. The storage capacitance electrode is configured by a storage capacitance which temporarily maintains the potential of the pixel electrode along with the pixel electrode and the capacitance insulation film. Typically, the storage capacitance electrode is formed from, for example, a transparent conductive material such as ITO in the same manner as the pixel electrode. As such, it is possible to form the storage capacitance in an opening region where light passes through and it is possible to increase the capacitance value thereof compared to a case where the storage capacitance is formed only in a non-opening region. Furthermore, the aperture ratio which is the proportion of the pixels in the opening region is not reduced without narrowing the opening region. For example, the storage capacitance electrode may be connected to a predetermined potential line which supplies a predetermined potential such as a common potential or a portion of the predetermined potential line may be the storage capacitance electrode.

Furthermore, the additional capacitance which is electrically connected to the data line is provided on the substrate. Typically, the additional capacitance is provided in a region (periphery region) between the periphery of the pixel region on the substrate and the periphery of the substrate. The additional capacitance has a first capacitance electrode which is formed in the same layer as the pixel electrode and a second capacitance electrode which is formed in the same layer as the storage capacitance electrode. Here, the "same layer" according to the invention means a layer which is formed using the same film depositing process. For example, the pixel electrode and the first capacitance electrode are formed in a state of being separated from each other by forming a thin film which is configured by, for example, a transparent conductive material such as ITO and partially removing the thin film, that is, by patterning. In addition, the storage capacitance electrode and the second capacitance electrode are formed in a state of being separated from each other by forming a thin film which is configured by, for example, a transparent conductive material such as ITO and partially removing the thin film, that is, by patterning. The first capacitance electrode is electrically connected to, for example, the predetermined potential line which supplies the predetermined potential such as a common potential and the second capacitance electrode is electrically connected to the data line.

In addition, the terminal, which is electrically connected to the first capacitance electrode via, for example, the predetermined potential line which supplies the predetermined potential such as a common potential, is provided in the periphery region on the substrate. For example, the terminal is formed as a terminal which comes into contact with a conductive member which has conductivity with regard to an opposing electrode which is provided so as to face the pixel electrode via an electro-optical material such as a liquid crystal or as a terminal for supplying the predetermined potential to the predetermined potential line from the outside.

According to the aspect of the invention, the terminal is formed in the same layer as the pixel electrode. That is, the pixel electrode, the first capacitance electrode, and the terminal are formed in the same layer as each other. That is, the terminal is a terminal which is formed using the same film depositing process as the pixel electrode and the first capacitance electrode and is formed from, for example, a transparent conductive material such as ITO which is the same as the pixel electrode and the first capacitance electrode.

Accordingly, it is possible to prevent the generation of galvanic corrosion in the wet treatment process (that is, a phenomenon where the first capacitance electrode is corroded by a battery effect or a battery action being generated between the terminal and the first capacitance electrode when the terminal and the first capacitance electrode are exposed at the same time to treatment liquid such as an etching liquid, resist peeling liquid, or the like which is used in the wet treatment process) which is possible if the case where, for example, the terminal is, for example, formed from a metal such as aluminum is assumed (that is, for example, in a case where the terminal is formed by a portion of the predetermined potential line, which is formed from a metal such as aluminum which is, for example, provided further towards a lower layer side than the pixel electrode, being exposed on the surface of the substrate).

As described above, according to the electro-optical device of the aspect of the invention, it is possible to prevent generation of galvanic corrosion in the wet treatment process and it is possible to perform high-quality display.

It is preferable that, in the electro-optical device according to the aspect of the invention, an opposing substrate, which is arranged so as to face the substrate, an opposing electrode, which is provided on the opposing substrate so as to face the pixel electrode, and a conductive member, which is provided in a position which overlaps with the terminal between the substrate and the opposing substrate and is electrically connected to the terminal and the opposing electrode, be provided.

According to the aspect, the terminal is formed as a terminal which comes into contact with the conductive member which has conductivity with regard to the opposing electrode which is provided so as to face the pixel electrode via an electro-optical material such as a liquid crystal. As such, it is possible to electrically connect the terminal and the opposing electrode reliably using the conductive member.

It is preferable that, in the electro-optical device according to the aspect of the invention, the distance between the terminal and the first capacitance electrode be less than 1500 um.

According to the aspect, since the terminal and the first capacitance electrode are arranged to be relatively close, it is possible to reduce the periphery region where the terminal and the first capacitance electrode are arranged while maintaining the size of the pixel region on the substrate. As such, it is possible to reduce or shrink the size of the substrate. Here, in particular, if a case where, for example, the terminal is, for example, formed from a metal such as aluminum is assumed, there is a concern that galvanic corrosion will be remarkably generated in the wet treatment process when the distance between the terminal and the first capacitance electrode is less than 1500 um. As such, in this case, in order to satisfy the performance and specifications which are demanded of the electro-optical device, it is necessary that the distance between the terminal and the first capacitance electrode is larger than 1500 um and it is difficult to reduce the size of the substrate. However, according to the aspect of the invention, since it is possible to prevent the generation of galvanic corrosion in the wet treatment process as described above, it is possible to provide the terminal and the first capacitance electrode in a position of being relatively close so that the distance between each other is less than 1500 um. As such, it is possible to reduce the size of the substrate.

It is preferable that, in the electro-optical device according to the aspect of the invention, the transparent conductive material be ITO.

According to the aspect, the pixel electrode, the first capacitance electrode, and the terminal are formed from ITO. Accordingly, it is possible to reliably prevent the generation of galvanic corrosion in the wet treatment process (that is, a phenomenon where the first capacitance electrode is corroded by a battery effect or a battery action being generated between the terminal formed of a metal and the first capacitance electrode formed from ITO) which is possible if the case where, for example, the terminal is, for example, formed from a metal such as aluminum is assumed.

An electronic apparatus according to another aspect of the invention is provided with the electro-optical device of the aspect (including each of the various modifications) of the invention.

According to the electronic apparatus of the other aspect of the invention, since the electro-optical device of the aspect of the invention is provided, it is also possible to realize various electronic apparatuses where it is possible to perform high-quality display such as a projection-type display device, a television, a mobile phone, an electronic notebook, a word processor, a video tape recorder of a view finder type or a monitor viewing type, a work station, a TV phone, a POS terminal, a touch panel, and the like. In addition, as the electronic apparatus of the other aspect of the invention, it is possible to realize an electrophoresis device, such as electronic paper, or the like.

The operations and other advantages of the invention will be made clear from an embodiment which will be described next.

BRIEF DESCRIPTION OF THE DRAWINGS

The invention will be described with reference to the accompanying drawings, wherein like numbers reference like elements.

DESCRIPTION OF EXEMPLARY EMBODIMENTS

Below, an embodiment of the invention will be described while referencing the diagram. In the embodiment below, a liquid crystal device with a TFT active matrix driving method, which is a type with a driving circuit built in and is an example of an electro-optical device of the invention, is used as an example.

First Embodiment

A liquid crystal device according to a first embodiment will be described with reference to FIGS. 1 to 8.

First, the overall configuration of the liquid crystal device according to the embodiment will be described with reference to FIGS. 1 and 2.

Figure 1:
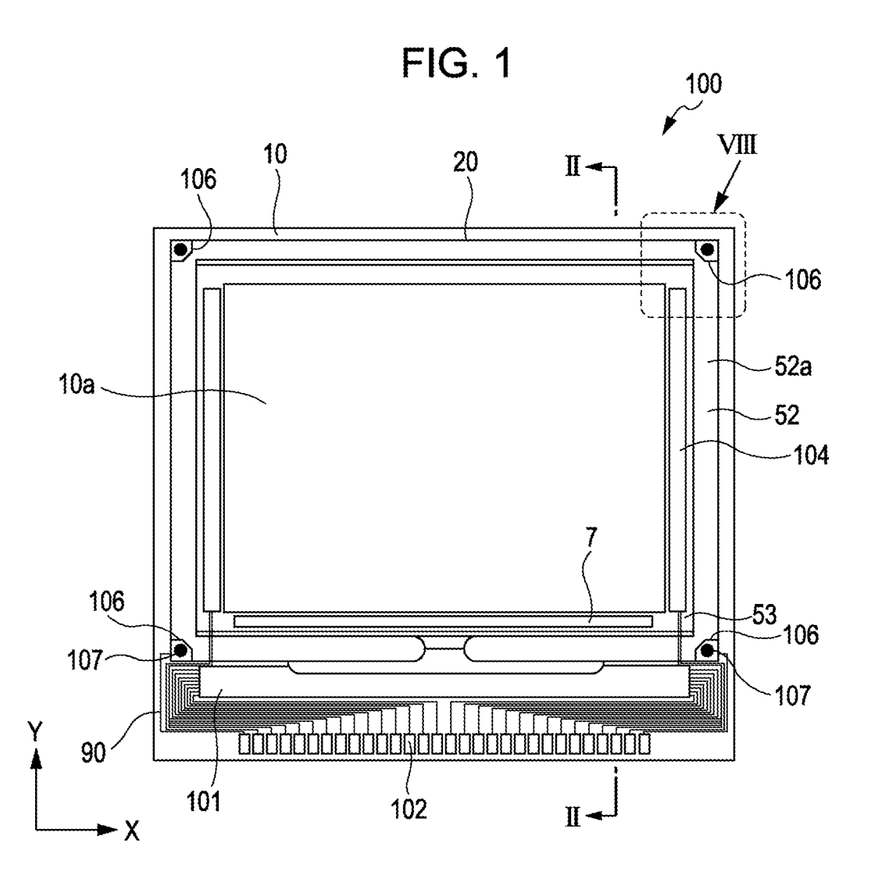
FIG. 1 is a planar diagram illustrating a configuration of a liquid crystal device according to a first embodiment.
Figure 2:
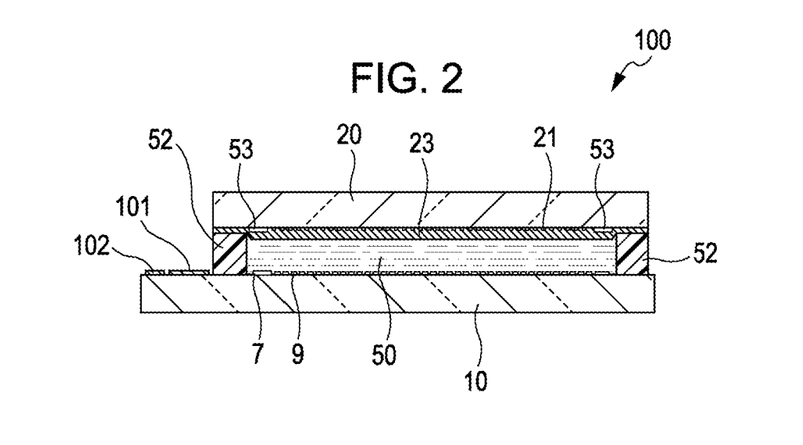
FIG. 2 is a cross-sectional diagram along a line II-II' of FIG. 1.

FIG. 1 is a planar diagram illustrating a configuration of the liquid crystal device according to the embodiment and FIG. 2 is a cross-sectional diagram along a line II-II' of FIG. 1.

In FIGS. 1 and 2, in a liquid crystal device 100 according to the embodiment, a TFT array substrate 10 and an opposing substrate 20 are disposed to face each other. The TFT array substrate 10 is, for example, a transparent substrate such as a quartz substrate, a glass substrate, or the like, a silicon substrate, or the like. The opposing substrate 20 is, for example, a transparent substrate such as a quartz substrate, a glass substrate, or the like. A liquid crystal layer 50 is sealed between the TFT array substrate 10 and the opposing substrate 20. Here, the TFT array substrate 10 is one example of the "substrate" according to the invention, and the opposing substrate 20 is one example of the "opposing substrate" according to the invention.

The TFT array substrate 10 and the opposing substrate 20 are bonded to each other using a seal member 52 which is provided in a seal region 52a which is positioned at the periphery of an image display region 10a which is an example of the "pixel region" according to the invention. The seal member 52 is, for example, formed from ultraviolet curing resin, heat curing resin, or the like in order to join together both of the substrates, and after being coated on the TFT array substrate 10 in the manufacturing process, is cured by ultraviolet irradiation, heating, or the like. In the seal member 52, gap members such as glass fibers, glass beads, or the like are dispersed in order to set the space between the TFT array substrate 10 and the opposing substrate 20 (that is, the gap between the substrates) to be a predetermined value.

A frame light-blocking film 53 with light blocking characteristics, which regulates a frame region of the image display region 10a in parallel with an inner side of the seal region 52a where the seal member 52 is arranged, is provided on the opposing substrate 20 side. In a region which is positioned on an outer side of the seal region 52a where the seal member 52 is arranged in the periphery region, a data line driving circuit 101 and an external circuit connection terminal 102 are provided along one side of the TFT array substrate 10. More to the inner side than the seal region along that side, a sampling circuit 7 is provided so as to be covered with the frame light-blocking film 53. In addition, at an inner side of the seal region along two sides which are adjacent to that side, a scanning line driving circuit 104 is provided so as to be cover with the frame light-blocking film 53. In addition, on the TFT array substrate 10, upper and lower conductive terminals 106 are provided in a region which faces the four corner portions of the opposing substrate 20 in order to connect both of the substrates using upper and lower conductive members 107. Due to this, it is possible to have electrical conductivity between the TFT array substrate 10 and the opposing substrate 20. Here, the upper and lower conductive terminals 106 are one example of the "terminal" according to the invention and the upper and lower conductive members 107 are one example of the "conductive member" according to the invention. The specific configuration of the upper and lower conductive terminals 106 and the upper and lower conductive members 107 will be described later with reference to FIGS. 7 and 8.

On the TFT array substrate 10, a routing wire 90 is formed for electrically connecting the external circuit connection terminal 102, the data line driving circuit 101, the scanning line driving circuit 104, the upper and lower conductive terminals 106, and the like.

In FIG. 2, on the TFT array substrate 10, a laminated structure is formed where wiring such as a TFT for pixel switching, a scanning line, a data line, and the like is built in. In the image display region 10a, a pixel electrode 9 is provided in a matrix format in an upper layer of wiring such as a TFT for pixel switching, a scanning line, a data line, and the like. The pixel electrode 9 is formed from ITO which is a transparent conductive material. An orientation film is formed on the pixel electrode 9. On the other hand, a light-blocking film 23 is formed on a surface of the opposing substrate 20 which faces the TFT array substrate 10. The light-blocking film 23 is, for example, formed from a metal film with light blocking characteristics or the like and is, for example, patterned in a grid shape or the like in the image display region 10a on the opposing substrate 20. Then, an opposing electrode 21 formed from a transparent material such as ITO is formed with no gaps in the image display region 10a on the light-blocking film 23 so as to face the plurality of pixel electrodes 9. An orientation film is formed on the opposing electrode 21. In addition, the liquid crystal layer 50 is, for example, formed from liquid crystals where nematic liquid crystals of one type or various types are mixed and has a predetermined orientation state between the pair of orientation films.

Here, although not shown, a checking circuit, a checking pattern, or the like may be formed for checking the quality, defects, and the like of the liquid crystal device during manufacturing or when shipping on the TFT array substrate 10 along with the data line driving circuit 101 and the scanning line driving circuit 104.

Next, an electrical configuration of the liquid crystal device according to the embodiment will be described with reference to FIG. 3.

Figure 3:
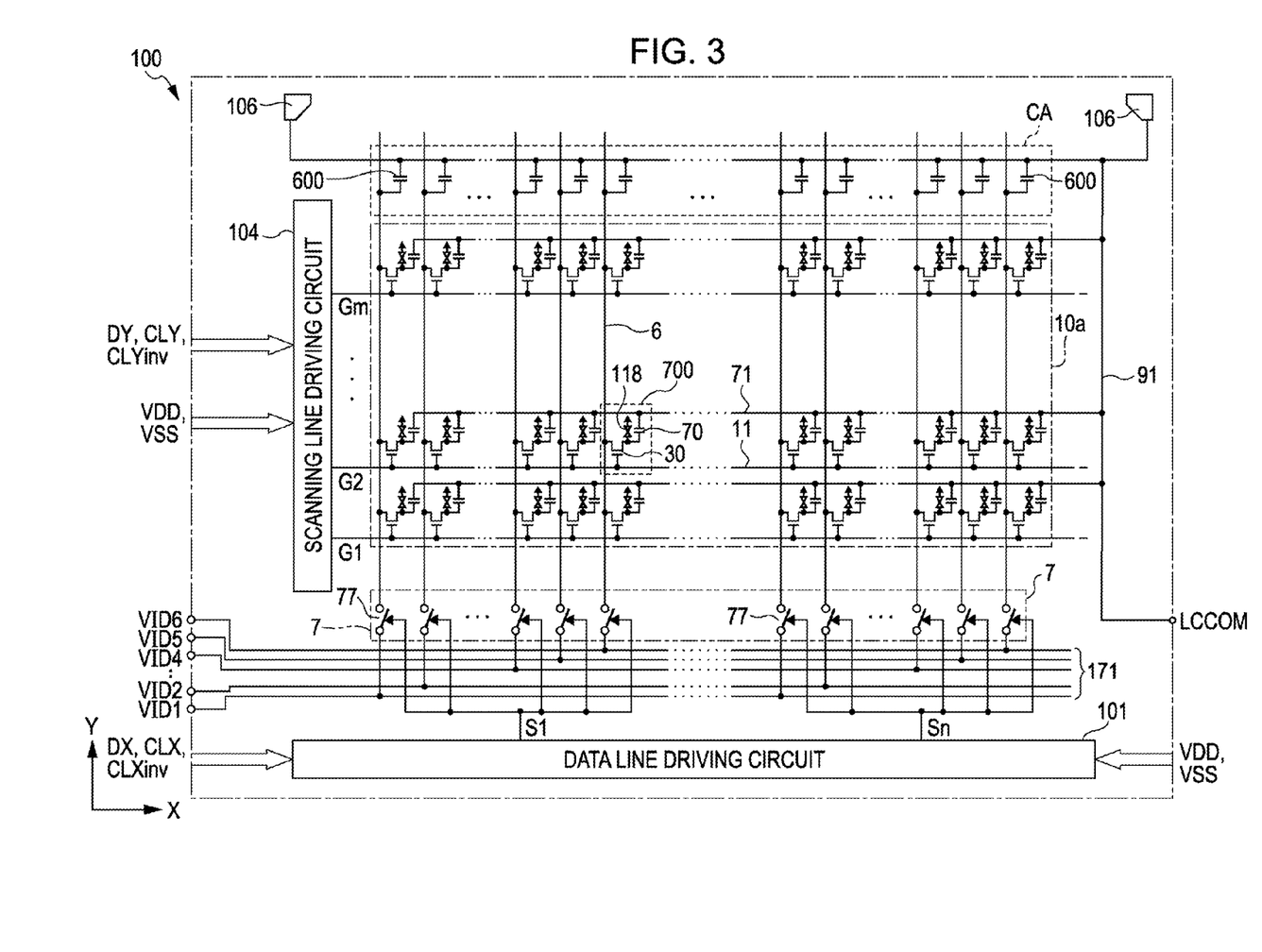
FIG. 3 is a block diagram illustrating an electrical configuration of the liquid crystal device according to the first embodiment.

FIG. 3 is a block diagram illustrating an electrical configuration of the liquid crystal device according to the embodiment.

In FIG. 3, the liquid crystal device 100 according to the embodiment is provided with the scanning line driving circuit 104, the data line driving circuit 101, the sampling circuit 7, an image signal line 171, a capacitance section CA, and the upper and lower conductive terminals 106 in the periphery region which is positioned in the periphery of the image display region 10a of the TFT array substrate 10.

In the scanning line driving circuit 104, a Y clock signal CLY, an inverse Y clock signal CLYinv, and a Y start pulse DY are supplied via the external circuit connection terminal 102 (refer to FIG. 1) from a timing control circuit (not shown) which is provided from the outside. When the Y start pulse DY is input, the scanning line driving circuit 104 sequentially generates and outputs a scanning signal Gi (i=1, ... , m) at a timing based on the Y clock signal CLY and the inverse Y clock signal CLYinv. In the scanning line driving circuit 104, a power source potential VDD on a high potential side and a power source potential VSS on a low potential side which has a potential lower than the power source potential on a high potential side are supplied via the external circuit connection terminal 102 from a power source circuit (not shown) which is provided from the outside.

In the data line driving circuit 101, an X clock signal CLX, an inverse X clock signal CLXinv, and an X start pulse DX are supplied via the external circuit connection terminal 102 from the timing control circuit which is provided from the outside. When the X start pulse DX is input, the data line driving circuit 101 sequentially generates and outputs a sampling signal Si (i=1, ... , n) at a timing based on the X clock signal CLX and the inverse X clock signal CLXinv. In the data line driving circuit 101, the power source potential VDD on a high potential side and the power source potential VSS on a low potential side are supplied via the external circuit connection terminal 102 from the power source circuit which is provided from the outside.

Each of the scanning line driving circuit 104 and the data line driving circuit 101 are provided with a signal processing unit such as a shift register or the like which includes a plurality of TFTs which are formed in the periphery region on the TFT array substrate 10.

The sampling circuit 7 is provided with a plurality of sampling switches 77 which are provided for each data line 6. Each of the sampling switches 77 is configured from a TFT with one type of channel of a P-channel or an N-channel. As a result, it is possible to arrange the plurality of sampling switches 77 with a finer pitch since it is sufficient if the area on the TFT array substrate 10 which is necessary for arranging each of the sampling switches 77 is small compared to a case where each of the sampling switches 77 is configured from a complementary type TFT is assumed.

In FIG. 3, the liquid crystal device 100 according to the embodiment is provided with a data line 6 and a scanning line 11 which are arranged vertically and horizontally in the image display region 10a which takes up the center of the TFT array substrate 10. The data line 6 is arranged along the X direction and the scanning line 11 is arranged along the Y direction. A pixel section 700 is provided in a matrix format in a position corresponding to an intersection point where the data line 6 and the scanning line 11 intersect each other.

The pixel section 700 is provided with a liquid crystal element 118, a TFT 30 for pixel switching, and a storage capacitance 70.

The liquid crystal element 118 is configured from the pixel electrode 9, the opposing electrode 21, and the liquid crystal layer 50 which is interposed between the pair of electrodes (refer to FIG. 2). The pixel electrode 9 maintains the liquid crystal capacitance which is formed between the pixel electrode 9 and the opposing electrode 21 for a constant period of time in accordance with an image signal.

The TFT 30 is provided in order to apply the image signal which is supplied from the data line 6 to a selection pixel. The gate of the TFT 30 is electrically connected to the scanning line 11 and the source of the TFT 30 is electrically connected to the data line 6. The drain of the TFT 30 is electrically connected to the pixel electrode 9 (refer to FIG. 2) which configures the liquid crystal element 118.

One capacitance electrode 71 of the storage capacitance 70 is electrically connected to a common potential line 91. The common potential line 91 is electrically connected to the power source circuit which is provided from the outside via the external circuit connection terminal 102 (refer to FIG. 1). A power source potential which is supplied to the common potential line 91 (and the capacitance electrode 71 which is electrically connected to the common potential line 91) is a common potential LCCOM which is supplied to the opposing electrode 21 (refer to FIG. 2) which is arranged to face the pixel electrode 9. That is, the potential of the capacitance electrode 71 of the storage capacitance 70 is maintained at the common potential LCCOM when the liquid crystal device is being driven. Here, in the embodiment, the common potential LCCOM has an intermediate potential which is between the power source potential VDD on a high potential side and the power source potential VSS on a low potential side.

The storage capacitance 70 is attached in parallel with the liquid crystal element 118. Since the voltage of the pixel electrode 9 is maintained by the storage capacitance 70 for a time longer than the time when the image signal is applied by, for example, three orders of magnitude, a high contrast ratio is realized as a result of the improvement in the maintenance characteristics. Here, the specific configuration of the storage capacitance 70 will be described in detail later.

Each image signal line 171 is electrically connected to the data line 6 which respectively corresponds thereto via the sampling circuit 7. The image signal of an N system (N=6 in the embodiment so that it is a six system), which is obtained by serial-parallel conversion of input image data VID of one system which is supplied from an external circuit, is supplied to each data line 6 via the sampling switch 77 which switches between on and off according to the sampling signal Si. The image signal in the N system is, for example, generated by the conversion of the input image data of one system using a signal conversion unit such as an image signal supply circuit (not shown) or the like. Here, the serial-parallel conversion is referred to as serial-parallel expansion or phase expansion.

In the embodiment, image signals VID1 to VID6 of the six system, that is, with six phases (N=6) are generated and six of the image signal lines 171 are provided to correspond to the image signals with six phases. Furthermore, in the image signals supply circuit (not shown), the voltages of each of the image signals VID1 to VID6 are reversed to positive polarities and negative polarities with regard to the common potential LCCOM which is a reference potential and the image signals VID1 to VID6 where the polarities have been reversed in this manner are output. Here, the number of phase expansions of the image signals (that is, the number of the system of the image signals where there is serial-parallel expansion) is not limited to six.

A capacitance section CA is provided with a plurality of additional capacitances 600. The plurality of additional capacitances 600 is electrically connected to the common potential line 91 and the data line 6. The additional capacitance 600 is connected to an end of the data line 6 which is the other end that is different to the end which is connected to the data line driving circuit 101. That is, the data line driving circuit 101 is arranged at one end of the data line 6 and the additional capacitance 600 is arranged at the other end of the data line 6. Here, the specific configuration of the additional capacitance 600 will be described in detail later.

Due to the additional capacitance 600, it is possible to reduce or prevent a reduction (that is, push-down) in the image signal potential which is supplied to the data line 6 compared to the original image signal potential when the sampling switch 77 is switched to an on state. That is, for example, with regard to a wiring capacitance of the data line 6 or the capacitance which is generated by the data line 6 and the adjacent wiring overlapping, it is possible to secure an appropriate capacitance around the data line 6 by adding the electrostatic capacitance of the additional capacitance 600. Accordingly, it is possible to suppress the generation of variation in the potential which is to be held in the data line 6, that is, the generation of push-down of the image signal potential which is written to the data line 6. As a result, it is possible to reduce or prevent the generation of display irregularities, for example, along the data line 6 which is caused by the push-down of the image signal potential which is written to the data line 6.

Here, in the embodiment, as will be described later, the plurality of data lines 6 are sequentially driven for each grouping of data lines where six data lines 6 are one grouping.

The upper and lower conductive terminals 106 are electrically connected to the common potential line 91. The upper and lower conductive terminals 106 are electrically connected to the opposing electrode 21 via the upper and lower conductive members 107 (refer to FIGS. 1 and 7). Due to this configuration, the common potential LCCOM is supplied to the opposing electrode 21 via the common potential line 91, the upper and lower conductive terminals 106, and the upper and lower conductive members 107.

Next, an operation principle of the liquid crystal device according to the embodiment will be described with reference to FIG. 3.

In FIG. 3, the liquid crystal device 100 according to the embodiment adopts a TFT active matrix driving method, sequentially applies the scanning signals G1, G2, . . . , Gm in lines to each scanning line 11 from the scanning line driving circuit 104 and applies the image signal to the data line 6 from the data line driving circuit 101 in a row in the horizontal direction of a selection pixel region where the TFT 30 is in an on state. At this time, the image signal may be sequentially supplied in lines to each data line 6. Due to this, the image signal is supplied to the pixel electrode 9 in the selection pixel region. Since the liquid crystal device 100 according to the embodiment is provided with the TFT array substrate 10 and the opposing substrate 20 so as to face via the liquid crystal layer 50 (refer to FIG. 2), the amount of transmitted light between both of the substrates is controlled for each pixel and the image is displayed in gradients by an electric field being applied to the liquid crystal layer 50 for each pixel which is arranged in sections as above.

The image signals VID1 to VID6 where there is serial-parallel expansion with six phases are supplied to each pixel section 700 via the N (six in the embodiment) image signal lines 171. The data lines 6 are sequentially driven for each data line grouping where six data lines 6 which correspond to the number of image signal lines 171 are one grouping as will be described below.

The sampling signals Si (i=1, 2, . . . , n) are sequentially supplied to each sampling switch 77 which corresponds to the data line groupings from the data line driving circuit 101 and each sampling switch 77 is in an on state in accordance with the sampling signal Si.

As such, the image signals VID1 to VID6 are sequentially supplied to the data lines 6, which belong at a data line grouping from each of the six image signal lines 171 via the sampling switch 77 which are switched to an on state, at the same time for each data line grouping and the data lines 6 which belong to one data grouping are driven together at the same time. Accordingly, according to the liquid crystal device 100 according to the embodiment, it is possible to suppress the driving frequency for driving the data lines 6 for each data line grouping.

In the liquid crystal element 118, the application voltage, which is regulated using the potential of each of the pixel electrode 9 and the opposing electrode 21, is applied. The liquid crystal modulates light by changing the orientation or ordering of the molecular association using the applied voltage level and a graduation display is possible. Images are displayed by the transmittance being reduced with regard to the incident light according to the voltage which is applied in units of each pixel in a normally white mode, the transmittance being increased with regard to the incident light according to the voltage which is applied in units of each pixel in a normally black mode, and light which has a contrast according to the image signals VID1 to VID6 being emitted from the entire liquid crystal device 100 according to the embodiment.

Next, the specific configuration of the pixel section of the liquid crystal device according to the embodiment will be described with reference to FIGS. 4 to 6.

Figure 4:
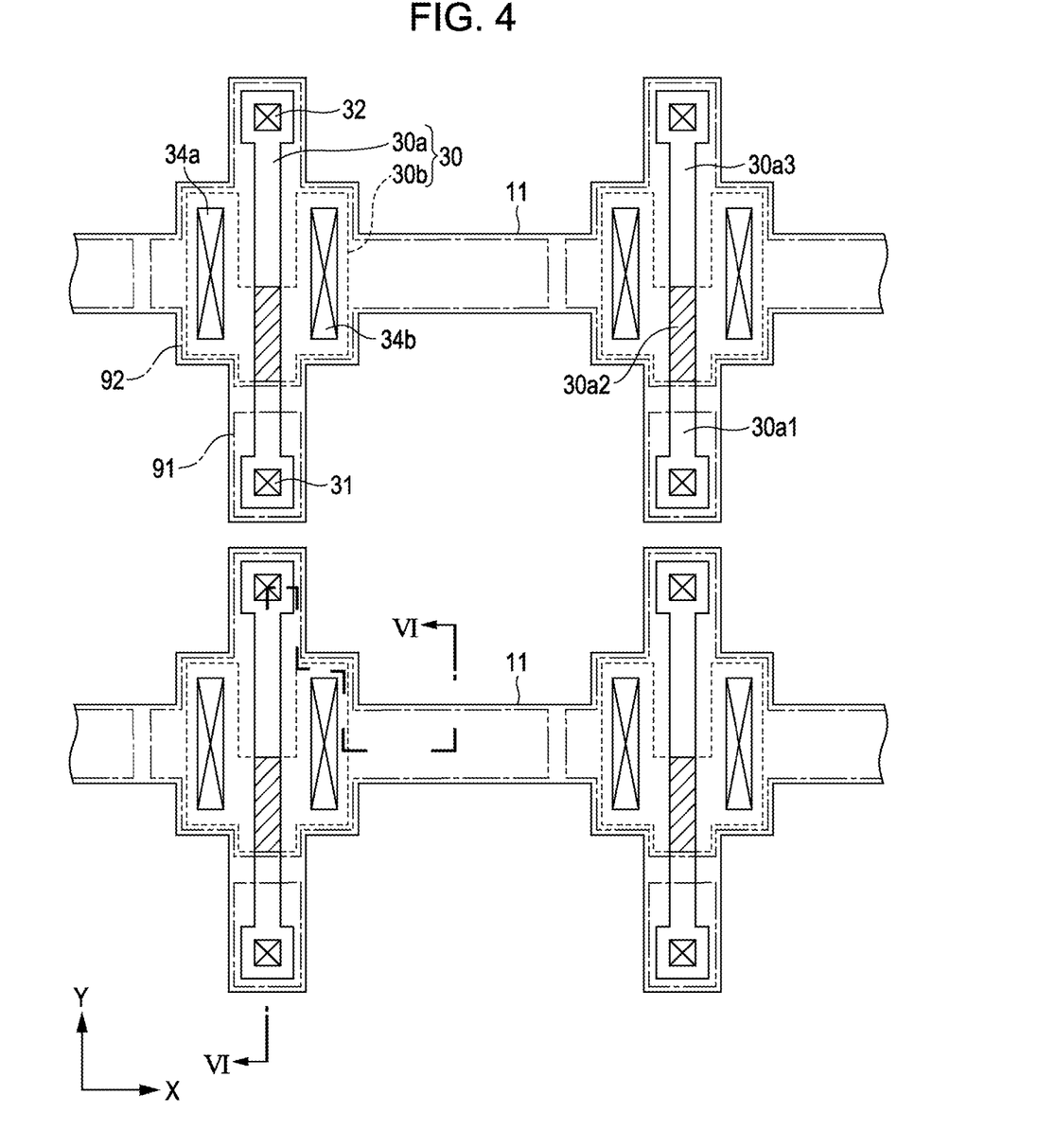
FIG. 4 is a (first) planar diagram transparently illustrating a configuration of a plurality of pixel sections according to the first embodiment.
Figure 5:
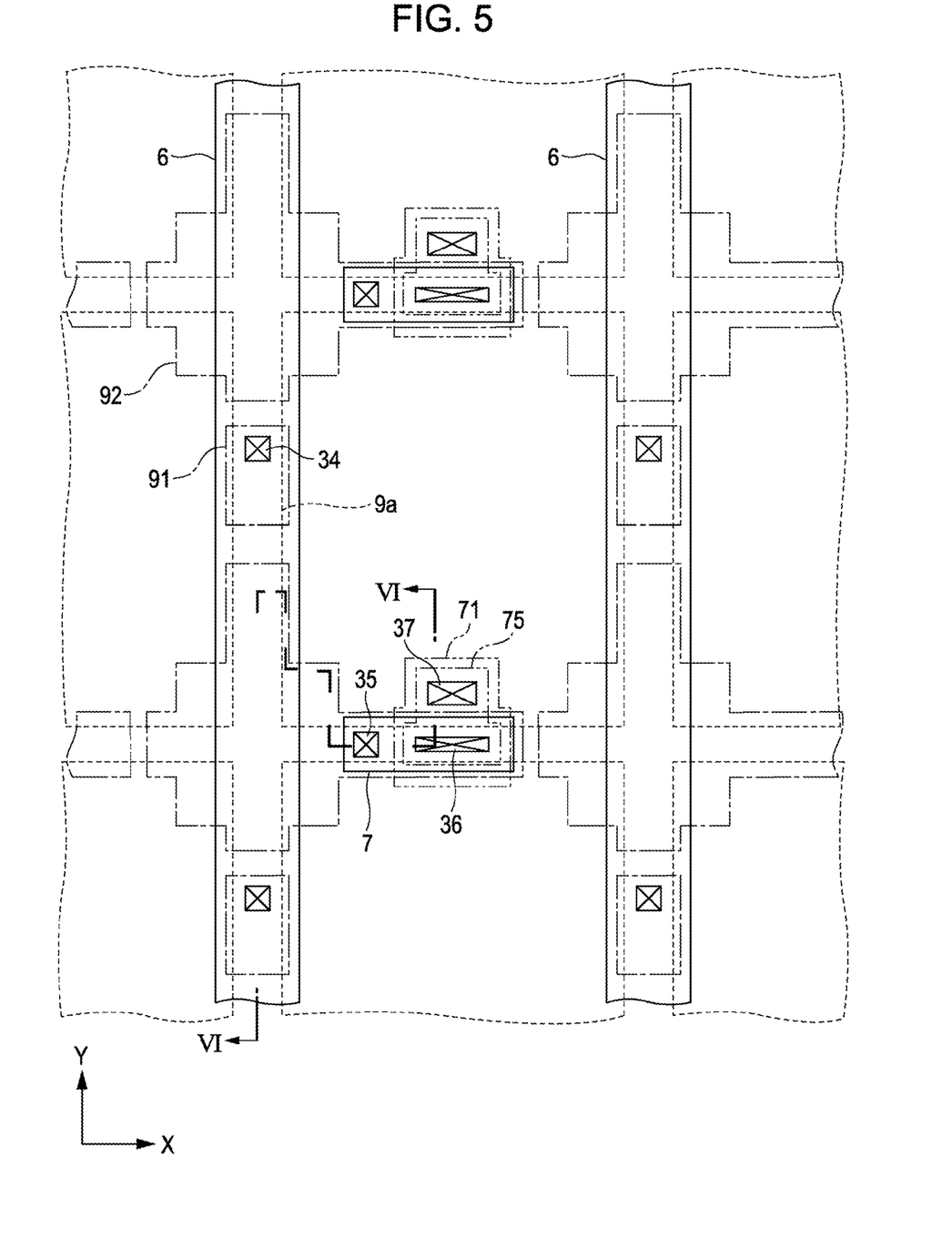
FIG. 5 is a (second) planar diagram transparently illustrating a configuration of the plurality of pixel sections according to the first embodiment.

FIGS. 4 and 5 are planar diagrams transparently illustrating a configuration of the plurality of pixel sections. FIG. 6 is a cross-sectional diagram illustrating a laminated structure of the pixel sections. Here, each layer which is provided further towards a lower layer side than relay layers 91 and 92 is shown in FIG. 4 and each layer which is provided further towards an upper layer side than the relay layers 91 and 92 is shown in FIG. 5. In addition, in FIGS. 4 to 6, the dimensions of each layer and each member may differ in order to make each layer and each member a size to the extent which is able to be recognized in the diagrams. FIG. 6 illustrates a cross section of a line VI-VI' of FIGS. 4 and 5, but since the dimensions of each layer and each member may differ as described above, there is a portion which does not completely correspond to the line VI-VI' in part.

Figure 6:
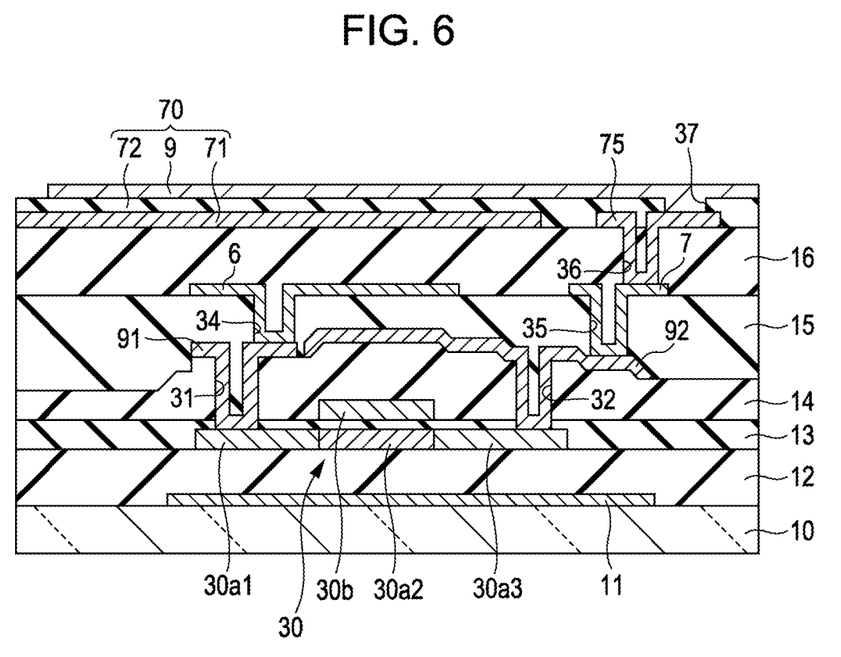
FIG. 6 is a cross-sectional diagram illustrating a laminated structure of the pixel sections according to the first embodiment.

In FIGS. 4 and 6, on the TFT array substrate 10, the scanning line 11 is arranged along the X direction and the TFT 30 which has a semiconductor layer 30a and a gate electrode 30b is arranged in a layer above the scanning line 11 via a ground insulation layer 12.

The scanning line 11 is formed from a conductive material with light blocking characteristics, for example, W (tungsten), Ti (titanium), and TiN (titanium nitride) and has a form so as to include the semiconductor layer 30a on the TFT array substrate 10 from a planar view. Since the scanning line 11 is arranging more to a lower layer side than the semiconductor layer 30a, it is possible to block almost all light or completely block light from a channel region 30a2 of the TFT 30 with regard to rear surface reflection in the TFT array substrate 10, returning light such as light which is generated from other devices by a projector with multiple plates or the like and penetrates through a composite optical system, and the like. As a result, it is possible to reduce the optical leak current of the TFT 30 and to improve the contrast ratio when operating the liquid crystal device 100 and a high-quality image display is possible.

The TFT 30 is provided with the semiconductor layer 30a and the gate electrode 30b. The semiconductor layer 30a has a source region 30a1, the channel region 30a2, and a drain region 30a3. Here, an LDD (Lightly Doped Drain) region may be formed in the interface between the channel region 30a2 and the source region 30a1 or in the interface between the channel region 30a2 and the drain region 30a3.

The gate electrode 30b is formed on an upper layer side of the semiconductor 30a in a region which overlaps with the channel region 30a2 of the semiconductor layer 30a via a gate insulation film 13 on the TFT array substrate 10 from a planar view. The gate electrode 30b is, for example, formed from conductive polysilicon and is electrically connected to the scanning line 11 which is arranged on a lower layer side via the contact holes 34a and 34b (refer to FIG. 4).

The source region 30a1 of the TFT 30 is electrically connected to the relay layer 91 which is formed on a first interlayer insulation film 14 via a contact hole 31. On the other hand, the drain region 30a3 is electrically connected to the relay layer 92 which is formed in the same layer as the relay layer 91 via a contact hole 32.

In FIGS. 5 and 6, the relay layer 91 is electrically connected to the data line 6 which is formed on a second insulation film 15 via a contact hole 34. The data line is, for example, formed from a metal such as aluminum or the like. On the other hand, the relay layer 92 is electrically connected to a relay layer 7 which is formed in the same layer as the data line 6 via a contact hole 35.

The relay layer 7 is further electrically connected to a relay layer 75 which is provided in the same layer as the capacitance electrode 71 which will be described later via a contact hole 36. In addition, the relay layer 75 is electrically connected to the pixel electrode 9 via a contact hole 37. That is, the drain region 30a3 of the TFT 30 and the pixel electrode 9 is electrically connected in relay via the relay layer 92, the relay layer 7, and the relay layer 75 in order.

In the upper layer side of the data line 6 and the relay layer 7, the storage capacitance 70 is formed via a third interlayer insulation film 16.

The storage capacitance 70 is configured from the capacitance electrode 71, a dielectric film 72 and the pixel electrode 9.

The capacitance electrode 71 is one example of the "storage capacitance electrode" according to the invention and is maintained at the common potential LCCOM by being electrically connected to the common potential line 91 (refer to FIG. 3). The capacitance electrode 71 is formed from ITO which is a transparent conductive material. As a result, the light transmission rate is hardly reduced, or in practice, not reduced at all in the opening region even when the capacitance electrode 71 is formed so as to overlap with the image display region 10a which includes the opening region. As shown in FIG. 5, the capacitance electrode 71 is formed so as to surround the relay layer 75 which is formed in an island shape. In other words, the relay layer 75 is formed at an inner side of the opening section of the capacitance electrode 71.

The dielectric film 72 is one example of the "capacitance insulation film" according to the invention and is formed with no gaps so as to cover the capacitance electrode 71. Here, since the dielectric film 72 is configured from silicon nitride or the like which is a conductive material with transparency, the light transmission rate is hardly reduced, or in practice, not reduced at all in the opening region even when the dielectric film 72 is formed widely on the image display region 10a which includes the opening region.

Since the storage capacitance 70 is configured using the capacitance electrode 71, the dielectric film 72, and the pixel electrode 9 which are each transparent, the aperture ratio which is the proportion of the pixels in the opening region is not reduced without narrowing the opening region. In addition, according to the storage capacitance 70, since it is possible to form the storage capacitance 70 in the opening region, it is possible to increase the capacitance value thereof compared to a case where the storage capacitance 70 is formed only in a non-opening region.

The pixel electrode 9 is formed on the dielectric film 72. The pixel electrode 9 is formed in an island shape for each pixel which is partitioned into a matrix format due to the data line 6 and the scanning line 11. Here, although not shown in the diagram, an orientation film is formed on the pixel electrode 9 for regulating the orientation state of the liquid crystal molecules which are included in the liquid crystal layer 50 (refer to FIG. 2).

Next, the specific configurations of the additional capacitance 600 and the upper and lower conductive terminals 106 described above with reference to FIG. 3 will be described with reference to FIGS. 7 and 8.

Figure 7:
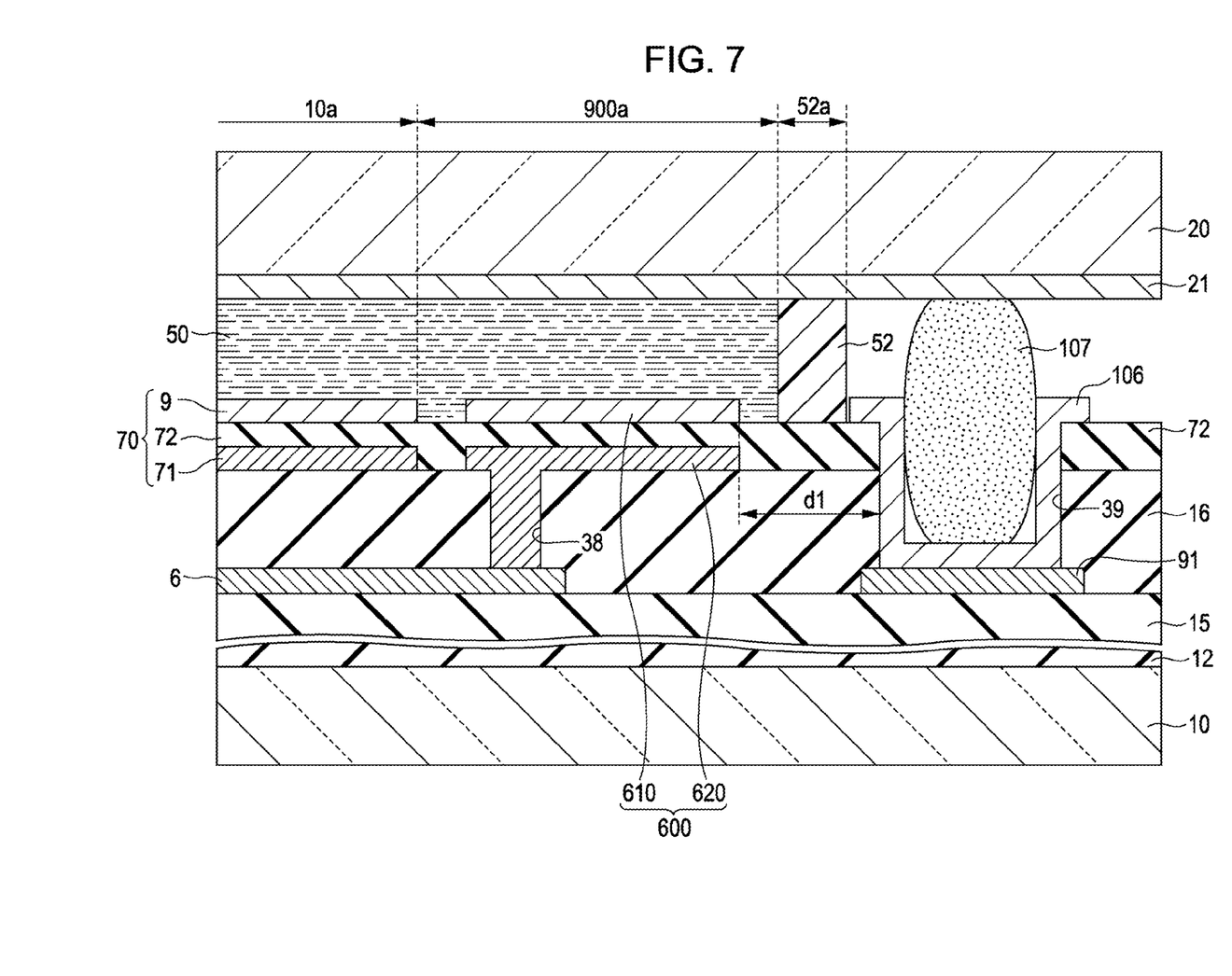
FIG. 7 is a cross-sectional diagram illustrating a configuration of an additional capacitance and upper and lower conductive terminals according to the first embodiment.

FIG. 7 is a cross-sectional diagram illustrating a configuration of the additional capacitance and the upper and lower conductive terminals according to the embodiment. FIG. 8 is a planar diagram schematically illustrating an arrangement of the additional capacitance and the upper and lower conductive terminals according to the embodiment. Here, in FIGS. 7 and 8, the dimensions of each layer and each member may differ in order to make each layer and each member a size to the extent which is able to be recognized in the diagrams. In addition, FIG. 7 illustrates a cross section of a line VII-VII' of FIG. 8. In addition, in FIG. 7, each member shown in FIGS. 1 and 2 is shown with appropriate omissions. In addition, FIG. 8 schematically illustrates an arrangement of the additional capacitance 600 and the upper and lower conductive terminals 106 in a portion VIII which is surrounded by the dashed line in FIG. 1.

In FIG. 7, the additional capacitance 600 is provided with an additional capacitance upper electrode 610 and an additional capacitance lower electrode 620 and is configured so that this pair of electrodes interposes the dielectric film 72.

The additional capacitance upper electrode 610 is an example of the "first capacitance electrode" according to the invention and is formed in the same layer as the pixel electrode 9 (that is, an ITO film arranged on the dielectric film 72) which is described above with reference to FIG. 6. That is, the additional capacitance upper electrode 610 is an electrode which is formed by the same film depositing process as the pixel electrode 9. That is, the pixel electrode 9 and the additional capacitance upper electrode 610 are formed by an ITO film being formed so as to cover the dielectric film 72 and the ITO film being patterned. The additional capacitance upper electrode 610 is formed so as to have a predetermined planar shape. The additional capacitance upper electrode 610 is electrically connected to the common potential line 91 in the same manner as the capacitance electrode 71 and is maintained at the common potential LCCOM when the liquid crystal device 100 is being driven. The common potential line 91 is formed in the same layer as the data line 6 (that is, a metal film such as an aluminum film which is arranged on the second interlayer insulation film 15). That is, the common potential line 91 and the data line 6 are formed by an aluminum film being formed so as to cover the second interlayer insulation film 15 and the aluminum film being patterned. The additional capacitance upper electrode 610 is electrically connected to the common potential line 91 via a contact hole (not shown) which is an opening which penetrates through the dielectric film 72 and the third interlayer insulation film 16.

The additional capacitance lower electrode 620 is an example of the "second capacitance electrode" according to the invention and is formed in the same layer as the capacitance electrode 71 (that is, an ITO film arranged on the third interlayer insulation film 16) which is described above with reference to FIG. 6. That is, the additional capacitance lower electrode 620 is an electrode which is formed by the same film depositing process as the capacitance electrode 71. That is, the capacitance electrode 71 and the additional capacitance lower electrode 620 are formed by an ITO film being formed so as to cover the third interlayer insulation film 16 and the ITO film being patterned. The additional capacitance lower electrode 620 is formed so as to face the additional capacitance upper electrode 610 via the dielectric film 72. The additional capacitance lower electrode 620 is electrically connected to the data line 6 via a contact hole 38 which is an opening in the third interlayer insulation film 16.

In this manner, the additional capacitance 600 is configured from the additional capacitance upper electrode 610 which is formed in the same layer as the pixel electrode 9, the additional capacitance lower electrode 620 which is formed in the same layer as the capacitance electrode 71, and the dielectric film 72 which is configured to be interposed between this pair of electrodes. In other words, the additional capacitance 600 and the storage capacitance 70 (refer to FIG. 5) is formed at the same opportunity in the manufacturing process. As such, by manufacturing the additional capacitance 600 and the storage capacitance 70 at the same opportunity, it is possible to prevent the lengthening of the manufacturing process, a higher degree of complication in the manufacturing process, and the like compared to a case where the additional capacitance 600 and the storage capacitance 70 are manufactured separately.

Figure 8:
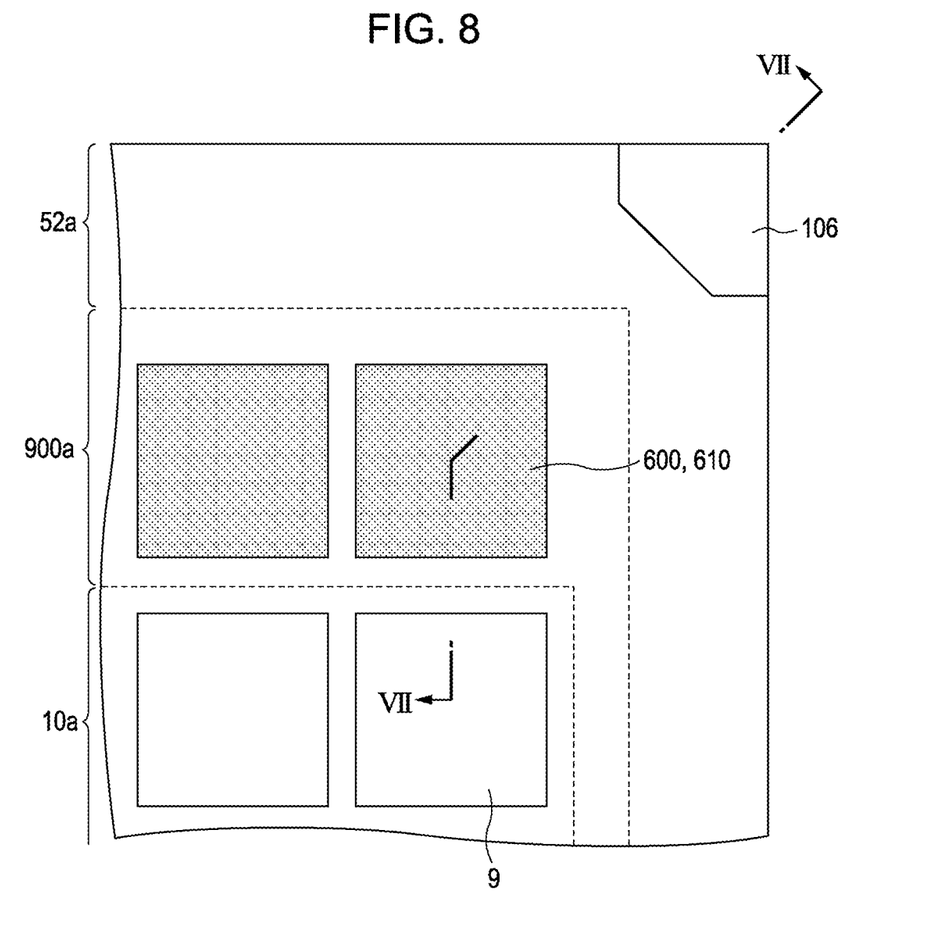
FIG. 8 is a planar diagram schematically illustrating an arrangement of the additional capacitance and the upper and lower conductive terminals according to the first embodiment.

In FIGS. 7 and 8, the additional capacitance 600 is arranged in a gap region 900a between the seal region 52a and the image display region 10a on the TFT array substrate 10. That is, the additional capacitance 600 is formed more to the image display region 10a side than the seal member 52 (refer to FIGS. 1 and 2) from a planar view (from a view in a normal direction of the TFT array substrate 10). According to the arrangement of the additional capacitance 600 in this manner, the additional capacitance upper electrode 610 which configures the additional capacitance 600 is not exposed to the outside after the TFT array substrate 10 and the opposing substrate 20 are joined together using the seal member 52 in the manufacturing process. As such, it is possible to reduce or prevent damage to the additional capacitance 600 such as the additional capacitance upper electrodes 610 which are adjacent to each other being shorted by a foreign body and the additional capacitance upper electrode 610 being damaged by a foreign body.

In FIG. 7, the upper and lower conductive terminals 106 are formed in the same layer as the pixel electrode 9 in the same manner as the additional capacitance upper electrodes 610 described above (that is, an ITO film arranged on the dielectric film 72). That is, the upper and lower conductive terminals 106 are terminals which are formed by the same film depositing process as the pixel electrode 9 and the additional capacitance upper electrode 610. The upper and lower conductive terminals 106 are formed as so to cover an opening section 39 which is formed in the dielectric film 72 and the third interlayer insulation film 16 so as to expose a portion of the common potential line 91 and are in contact with the common potential line 91 in the opening section 39. In the upper and lower conductive terminals 106, the upper and lower conductive members 107 (refer to FIG. 1) where silver powder or the like is mixed in a medium in a paste form are provided so as to fill in the opening section 39. The upper and lower conductive members 107 are arranged so that one portion is in contact with the upper and lower conductive terminals 106 and the other portion is in contact with the opposing electrode 21 which is formed on the opposing substrate 20. Due to this, it is possible to supply the common potential LCCOM which is supplied using the common potential line 91 from the upper and lower conductive terminals 106 to the opposing electrode 21. Here, the upper and lower conductive members 107 may be arranged in the seal member 52 for adhering between the TFT array substrate 10 and the opposing electrode 20.

In the embodiment, in particular, as described above, the upper and lower conductive terminals 106 are terminals which are formed by the same film depositing process as the pixel electrode 9 and the additional capacitance upper electrode 610 and are formed from the same ITO as the pixel electrode 9 and the additional capacitance upper electrode 610.

Accordingly, it is possible to prevent the generation of galvanic corrosion in the wet treatment process (that is, a phenomenon where the additional capacitance upper electrode 610 is corroded by a battery effect or a battery action being generated between the upper and lower conductive terminals 106 and the additional capacitance upper electrode 610 when the upper and lower conductive terminals 106 and the additional capacitance upper electrode 610 are exposed at the same time to treatment liquid such as an etching liquid, resist peeling liquid, or the like which is used in the wet treatment process) which is possible if the case where, for example, the upper and lower conductive terminals 106 are, for example, formed from a metal such as aluminum is assumed.

Here, a configuration of the liquid crystal device according to a comparative example will be described with reference to FIG. 9.

Figure 9:
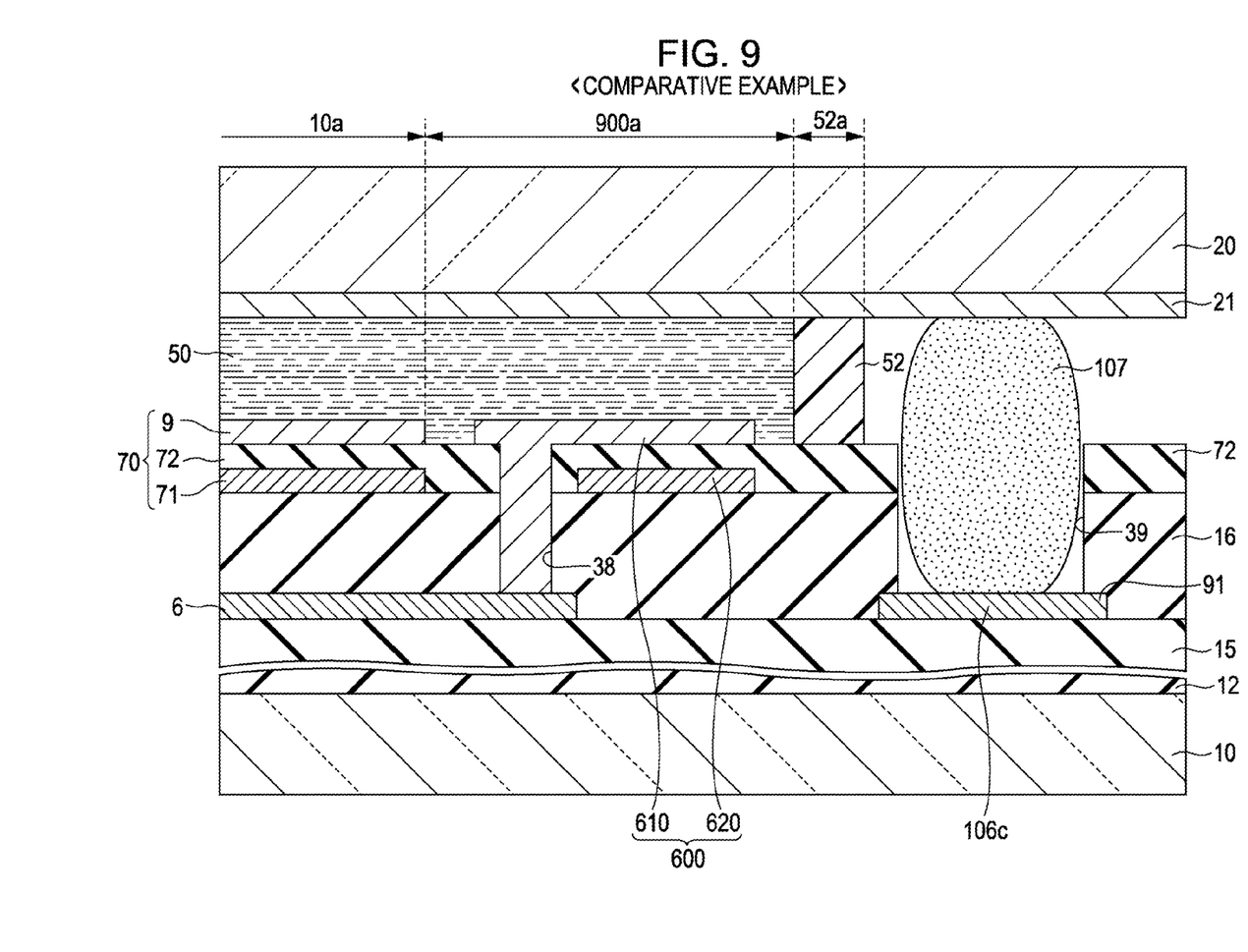
FIG. 9 is a cross-sectional diagram illustrating a configuration of a liquid crystal device according to a comparative example for the same purpose as FIG. 7.

FIG. 9 is a cross-sectional diagram illustrating a configuration of the liquid crystal device according to the comparative example for the same purpose as FIG. 7. Here, the constituent elements which are the same as the constituent elements according to the first embodiment which is shown in FIG. 7 are given the same reference numerals and the description thereof is not repeated.

In FIG. 9, the liquid crystal device according to the comparative example differs from the liquid crystal device 100 according to the embodiment in the point where upper and lower conductive terminals 106c are provided instead of the upper and lower conductive terminals 106 according to the invention (refer to FIG. 7) and is generally configured in the same manner as the liquid crystal device 100 according to the embodiment in other points.

The upper and lower conductive terminals 106c are formed in the same layer as the common potential line 91 (that is, a metal film such as an aluminum film arranged on the second interlayer insulation film 15) and are formed so as to be exposed from an opening section 39 which is an opening in the third interlayer insulation film 16. In other words, the upper and lower conductive terminals 106c is a portion out of the common potential line 91 which is exposed by the opening section 39. According to the configuration of the comparative example, since the upper and lower conductive terminals 106c are formed from aluminum, there is a concern that there may be galvanic corrosion in a wet process such as wet etching, peeling off of a photoresist, or the like which is performed, for example, when forming the opening section 39 which exposes the upper and lower conductive terminals 106c or when patterning the additional capacitance upper electrode 610 and the pixel electrode 9 in the manufacturing process. That is, the additional capacitance upper electrode 610 formed from ITO which is arranged on the uppermost layer on the TFT array substrate 10 and the upper and lower conductive terminals 106c which are, for example, formed from a metal such as aluminum or the like are electrically connected via the common potential line 91. As a result, there is a concern that a current may flow between the upper and lower conductive terminals 106c and the additional capacitance upper electrode 610 due to treatment liquid such as etching liquid, resist peeling liquid, or the like which is used in the wet treatment process and there may be galvanic corrosion such as the additional capacitance upper electrode 610 formed from ITO being dissolved in the treatment liquid or being corroded.

However, according to the embodiment, as described above, since the upper and lower conductive terminals 106 are formed from the same ITO as the additional capacitance upper electrode 610, it is possible to prevent galvanic corrosion in the wet treatment process.

In FIG. 7, in the embodiment, in particular, a distance dl between the upper and lower conductive terminals 106 and the additional capacitance upper electrode 610 is less than 1500 um. That is, the upper and lower conductive terminals 106 and the additional capacitance upper electrode 610 are arranged to be close to each other compared to, for example, the comparative example which is described with reference to FIG. 9. As such, it is possible to reduce the periphery region where the upper and lower conductive terminals 106 and the additional capacitance upper electrode 610 are arranged while maintaining the size of the image display region 10a on the TFT array substrate 10. As such, it is possible to reduce or shrink the size of the TFT array substrate 10. Here, in particular, if a case where, for example, the upper and lower conductive terminals 106c are, for example, formed from a metal such as aluminum is assumed as in the comparative example which is described with reference to FIG. 9, there is a concern that galvanic corrosion may be remarkably generated in the wet treatment process when the distance between the upper and lower conductive terminals 106c and the additional capacitance upper electrode 610 is less than 1500 um. As such, in the case of the comparative example shown in FIG. 9, in order to satisfy the performance and specifications which are demanded of the liquid crystal device, it is necessary that the generation of the galvanic corrosion is suppressed or prevented by the distance between the upper and lower conductive terminals 106c and the additional capacitance upper electrode 610 being larger than 1500 um and it is difficult to reduce the size of the TFT array substrate 10. However, according to the embodiment, since it is possible to prevent the generation of galvanic corrosion in the wet treatment process as described above, it is possible to provide the upper and lower conductive terminals 106 and the additional capacitance upper electrode 610 in a position of being relatively close so that the distance between each other is less than 1500 um. As such, according to the liquid crystal device 100 of the embodiment, it is possible to reduce the size of the TFT array substrate 10 and it is possible to reduce the size of the liquid crystal device 100.

As described above, according to the liquid crystal device 100 of the embodiment, it is possible to prevent generation of galvanic corrosion in the wet treatment process and it is possible to perform high-quality display.

Electronic Apparatus

Next, a case where the liquid crystal device which is the electro-optical device described above is applied to various electronic apparatuses will be described.

Figure 10:
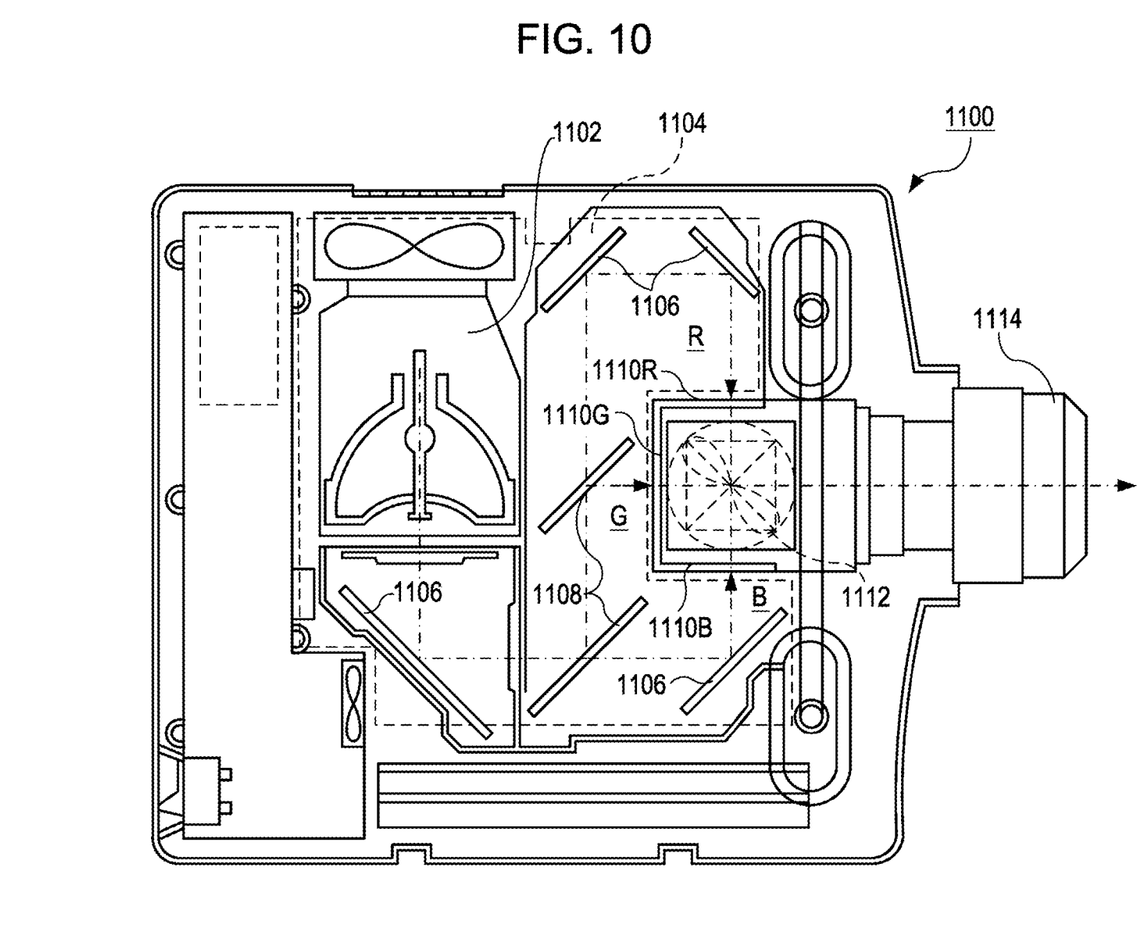
FIG. 10 is a planar diagram illustrating a configuration of a projector which is one example of an electronic apparatus where an electro-optical device is applied.

FIG. 10 is a planar diagram illustrating a configuration example of a projector. Below, a projector which uses the liquid crystal device as a light valve will be described.

As shown in FIG. 10, in an inner portion of a projector 1100, a lamp unit 1102 which is a white light source such as a halogen lamp is provided. The projection light which is emitted from the lamp unit 1102 is separated into three primary colors of RGB using four mirrors 1106 and two dichroic mirrors 1108 which are arranged in a light guide 1104 and is incident on liquid crystal panels 1110R, 1110B, and 1110G as the light valves which correspond to each primary color.

The configuration of the liquid crystal panels 1110R, 1110B, and 1110G is the same as the liquid crystal device described above and the liquid crystal panels 1110R, 1110B, and 1110G are respectively driven by R, G, and B primary color signals supplied from the image signal processing circuit. Then, the light which is modified using the liquid crystal panels is incident from three directions in a dichroic prism 1112. In the dichroic prism 1112, while the R and B light are refracted by 90 degrees, the G light goes straight ahead. Accordingly, as a result of each color image being combined, a color image is projected on a screen or the like via a projection lens 1114.

Here, when focusing on the display image using each of the liquid crystal panels 1110R, 1110B, and 1110G, it is necessary that the display image using the liquid crystal panels 1110G is reversed left and right with regard to the display image using the liquid crystal panels 1110R and 1110B.

Here, in the liquid crystal panels 1110R, 1110B, and 1110G, it is not necessary to provide a color filter since the light which corresponds to each primary color of R, G, and B is incident using the dichroic mirrors 1108.

Here, other than the electronic apparatus described with reference to FIG. 10, there are mobile personal computers, mobile phones, liquid crystal televisions, video tape recorders of a view finder type or a monitor viewing type, car navigation devices, pagers, electronic notebooks, calculators, word processors, work stations, TV phones, POS terminals, devices provided with touch panels, and the like. Moreover, it is needless to say that the liquid crystal device of the embodiment is able to be applied to these electronic apparatuses.

In addition, the invention is also able to be applied to reflection type liquid crystal devices (LCOS), plasma displays (PDP), field emission displays (FED, SED), organic EL displays, digital micromirror devices (DMD), electrophoretic display devices, and the like as well as the liquid crystal device described in the embodiment above.

The invention is not limited to the embodiment described above but may be appropriately modified in the scope of the claims and the scope of the concept or the spirit of the invention which can be understood from the entire specification. An electro-optical device having such modifications and an electronic apparatus having the electro-optical device are also included in the technical scope of the invention.

This application claims priority from Japanese Patent Application No. 2010-258645 filed in the Japanese Patent Office on Nov. 19, 2010, the entire disclosure of which is hereby incorporated by reference in its entirely.

What is claimed is:

1. An electro-optical device comprising:
a substrate;
a data line which is provided in a pixel region;
a transistor which is electrically connected with the data line;
a pixel electrode formed from a transparent conductive material which is positioned on a side of the substrate opposite to the data line so as to correspond to the transistor;
a storage capacitance electrode which is provided in a layer between the pixel electrode and the data line so as to face the pixel electrode;
a capacitance insulation film which is provided between the pixel electrode and the storage capacitance electrode;
an additional capacitance which has a first capacitance electrode which is formed in the same layer as the pixel electrode and a second capacitance electrode which is formed in the same layer as the storage capacitance electrode and is electrically connected to the data line, and which is provided between the pixel region and a first side of the substrate; and
a terminal which is provided between the pixel region and the first side, is electrically connected to the first capacitance electrode, and is formed in the same layer as the pixel electrode.

2. The electro-optical device according to claim 1, further comprising:
an opposing substrate which is arranged so as to face the substrate;
an opposing electrode which is provided on a side of the opposing substrate which faces the pixel electrode; and
a conductive member which is provided in a position which overlaps in a planar view with the terminal which is positioned between the substrate and the opposing substrate and is electrically connected to the terminal and the opposing electrode.

3. The electro-optical device according to claim 1, wherein the distance between the terminal and the first capacitance electrode is less than 1500 um.

4. The electro-optical device according to claim 1, wherein the transparent conductive material is ITO (Indium Tin Oxide).

5. The electro-optical device according to claim 1, wherein the additional capacitance is further provided with a dielectric film which is provided between the first capacitance electrode and the second capacitance electrode and extends from the capacitance insulation film.

6. An electronic apparatus comprising:
the electro-optical device according to claim 1.

* * * * *